US012567861B2

(12) United States Patent
Khan P et al.

(10) Patent No.: US 12,567,861 B2
(45) Date of Patent: Mar. 3, 2026

(54) PRE-EMPHASIS BUFFER SYSTEMS AND RELATED METHODS

(71) Applicant: SEMICONDUCTOR COMPONENTS INDUSTRIES, LLC, Phoenix, AZ (US)

(72) Inventors: Athar Ali Khan P, Bangalore (IN); Manish Kumar Vishwakarma, Azamgarh (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 1002 days.

(21) Appl. No.: 17/188,536

(22) Filed: Mar. 1, 2021

(65) Prior Publication Data

US 2022/0278685 A1     Sep. 1, 2022

(51) Int. Cl.
| | |
|---|---|
| *H03K 19/0185* | (2006.01) |
| *G06F 13/40* | (2006.01) |
| *G06F 13/42* | (2006.01) |
| *H03K 19/003* | (2006.01) |
| *H04L 25/02* | (2006.01) |
| *H04L 25/03* | (2006.01) |
| *H04L 25/20* | (2006.01) |

(52) U.S. Cl.
CPC . *H03K 19/018521* (2013.01); *G06F 13/4072* (2013.01); *G06F 13/4282* (2013.01); *H03K 19/018571* (2013.01); *H04L 25/028* (2013.01); *H04L 25/03343* (2013.01); *H04L 25/20* (2013.01); *G06F 2213/0042* (2013.01); *H03K 19/00323* (2013.01)

(58) Field of Classification Search
CPC ..... H03K 19/018521; H03K 19/00323; H03K 19/018571; G06F 13/4072; G06F 13/4282; G06F 2213/0042; H04L 25/028; H04L 25/03343
See application file for complete search history.

(56) References Cited

U.S. PATENT DOCUMENTS

| | | | | |
|---|---|---|---|---|
| 6,861,739 B1 * | 3/2005 | Bhavnagarwala | .. | H01L 23/5286 257/691 |
| 6,940,302 B1 * | 9/2005 | Shumarayev | .. | H03K 19/018585 326/26 |
| 7,215,144 B2 * | 5/2007 | Mitby | ................. | H04L 25/0288 326/82 |
| 7,667,502 B2 * | 2/2010 | Agarwal | ........ | H03K 19/018528 327/108 |

(Continued)

*Primary Examiner* — Menatoallah Youssef
*Assistant Examiner* — Khareem E Almo
(74) *Attorney, Agent, or Firm* — IPTechLaw

(57) ABSTRACT

Implementations of a pre-emphasis signal processing system may include an output driver which may include a pre-emphasis transistor coupled with a steady state transistor, where gates of the pre-emphasis transistor and steady state transistor may be coupled together. The system may include a regulator voltage input coupled to a source of the pre-emphasis transistor; a first resistor coupled between a drain of the pre-emphasis transistor and an output of the output driver; and a second resistor coupled between the drain of the steady state transistor and the output of the output driver; and a pre-emphasis source including a current source coupled to a delay transistor, the delay transistor coupled with the output of the output driver.

20 Claims, 11 Drawing Sheets

(56)                         References Cited

U.S. PATENT DOCUMENTS

| | | | |
|---|---|---|---|
| 7,800,413 B2 * | 9/2010 | Lee | G09G 3/3611 |
| | | | 327/108 |
| 8,754,677 B2 * | 6/2014 | Chen | G05F 1/565 |
| | | | 327/112 |
| 8,963,646 B1 * | 2/2015 | Ma | H03L 7/00 |
| | | | 327/161 |
| 10,057,090 B2 * | 8/2018 | Hafizi | G05F 1/56 |
| 2002/0135404 A1 | 9/2002 | Payne et al. | |
| 2012/0161816 A1 | 6/2012 | Seth et al. | |

* cited by examiner

PRE-EMPHASIS BUFFER SYSTEMS AND RELATED METHODS

BACKGROUND

1. Technical Field

Aspects of this document relate generally to signal processing systems. More specific implementations involve universal serial bus signal processing systems.

2. Background

Signal processing systems utilize voltage or current to transmit information in various forms. In some signal processing systems, a voltage signal with a frequency is used to transmit information. The information may be voice data, binary data, digital data or any other desired information.

SUMMARY

Implementations of a pre-emphasis signal processing system may include an output driver which may include a pre-emphasis transistor coupled with a steady state transistor, where gates of the pre-emphasis transistor and steady state transistor may be coupled together. The system may include a regulator voltage input coupled to a source of the pre-emphasis transistor; a first resistor coupled between a drain of the pre-emphasis transistor and an output of the output driver; and a second resistor coupled between the drain of the steady state transistor and the output of the output driver; and a pre-emphasis source including a current source coupled to a delay transistor, the delay transistor coupled with the output of the output driver.

Implementations of a pre-emphasis signal processing system may include one, all, or any of the following:

The delay transistor may be a first delay buffer chain delay transistor.

The system may include a second delay buffer chain delay transistor.

The output of the output driver may be configured to be coupled to a signal input of a universal serial bus 2.0 device.

The pre-emphasis transistor may be a PMOS transistor and the steady state transistor may be an NMOS transistor.

The system may include an output of a buffer chain coupled to a signal input of the output driver.

The signal input of the buffer chain may be configured to couple with an embedded universal serial bus device.

Implementations of a pre-emphasis signal processing system may include a first output driver may include a first pre-emphasis transistor coupled with a first steady state transistor where gates of the first pre-emphasis transistor and the first steady state transistor may be coupled together. The system may include a regulator voltage input coupled to a source of the first pre-emphasis transistor; and a first signal input coupled with a first buffer chain configured to be coupled to a negative terminal of an input device; and a first pre-emphasis source including a pre-emphasis current source coupled to a first delay transistor, the first delay transistor coupled with an output of the first output driver. The system may include a second output driver which may include a second pre-emphasis transistor coupled with a second steady state transistor, where gates of the second pre-emphasis transistor and the second steady state transistor may be coupled together; the regulator voltage input coupled to a source of the second pre-emphasis transistor; and a second signal input coupled with a second buffer chain configured to be coupled to a positive terminal of the input device. Systems may include a second pre-emphasis source including the pre-emphasis current source coupled to a second delay transistor, the second delay transistor coupled with an output of the second output driver.

Implementations of a pre-emphasis signal processing system may include one, all, or any of the following:

The system may include: a first resistor coupled between a drain of the first pre-emphasis transistor and the output of the first output driver; a second resistor coupled between a drain of the first steady state transistor and the output of the first output driver; a third resistor coupled between the drain of the second pre-emphasis transistor and the output of the second output driver; and a fourth resistor coupled between the drain of the second steady state transistor and the output of the second output driver.

The first delay transistor and the second delay transistor may be first delay buffer chain delay transistors.

The system may include a third delay buffer chain delay transistor and a fourth delay buffer chain delay transistor.

The output of the first output driver and the output of the second output driver may be configured to be coupled to a positive signal input and to a negative signal input, respectively, of a universal serial bus 2.0 device.

The first pre-emphasis transistor and the second pre-emphasis transistor may be both PMOS transistors and the first steady state transistor and the second steady state transistor may be both NMOS transistors.

The system may include an output of a first buffer chain coupled to a signal input of the first output driver and an output of a second buffer chain coupled to a signal input of the second output driver.

The signal input of the first buffer chain may be configured to couple with a negative terminal of an embedded universal serial bus device and a signal input of the second buffer chain may be configured to couple with a positive terminal of the embedded universal serial bus device.

Implementations of a method of pre-emphasis signal processing may include generating rising pre-emphasis in a voltage signal by: using a first output driver, turning on a first pre-emphasis transistor, where a regulator voltage input is coupled with a source of the first pre-emphasis transistor; and, using a first pre-emphasis source, turning on a first delay transistor coupled to a pre-emphasis current source and to an output of the first output driver. The method may further include increasing an initial voltage of an input signal received by the first output driver using the first pre-emphasis current source and a resistor coupled between a drain of the first pre-emphasis transistor and an output of the first output driver; and generating falling pre-emphasis in the voltage signal by using a second output driver to turn on a steady state transistor. The method may further include, using a second pre-emphasis source, turning off a second delay transistor coupled to the first pre-emphasis current source and with an output of the second output driver; and decreasing an initial voltage of the input signal received by the second output driver using the first pre-emphasis current source and a resistor coupled between a drain of a second pre-emphasis transistor and an output of the second output driver.

Implementations of a method of pre-emphasis signal processing may include one, all, or any of the following:

The output of the first output driver and the output of the second output driver may be configured to be coupled to a positive signal input and to a negative signal input, respectively, of a universal serial bus 2.0 device.

The method may include: buffering data using a first buffer chain coupled to a signal input of the first output driver; and buffering data using a second buffer chain coupled to a signal input of the second output driver.

The method may include: delaying data for a period of a unit interval of a data rate using a first delay buffer chain coupled to a signal input of the first output driver; delaying data for the period of the unit interval of the data rate using a second delay buffer chain coupled to a signal input of the second output driver; and using the first delay buffer chain and the second delay buffer chain, timing the rising pre-emphasis and the falling pre-emphasis in the voltage signal.

The signal input of the first buffer chain may be configured to couple with a negative terminal of an embedded universal serial bus device and a signal input of the second buffer chain may be configured to couple with a positive terminal of the embedded universal serial bus device.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended pre-emphasis buffer systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such pre-emphasis buffer systems, and implementing components and methods, consistent with the intended operation and methods.

Embedded universal serial bus (eUSB) is an embedded USB standard defined as an interface between legacy USB devices and a new generation of USB devices. In order for eUSB devices to communicate with legacy USB devices, a signal processing system called a repeater interface is utilized. Various repeater interface implementations include buffers designed to enable the handling of different data rates for the devices on each side of the repeater. A repeater interface is a voltage level translator between one device and another that allows for signals of different voltages and data rates to properly be translated. One of the operational characteristics of an effective repeater interface is the ability to perform the voltage translation while consuming as little power as possible.

Figure 1:
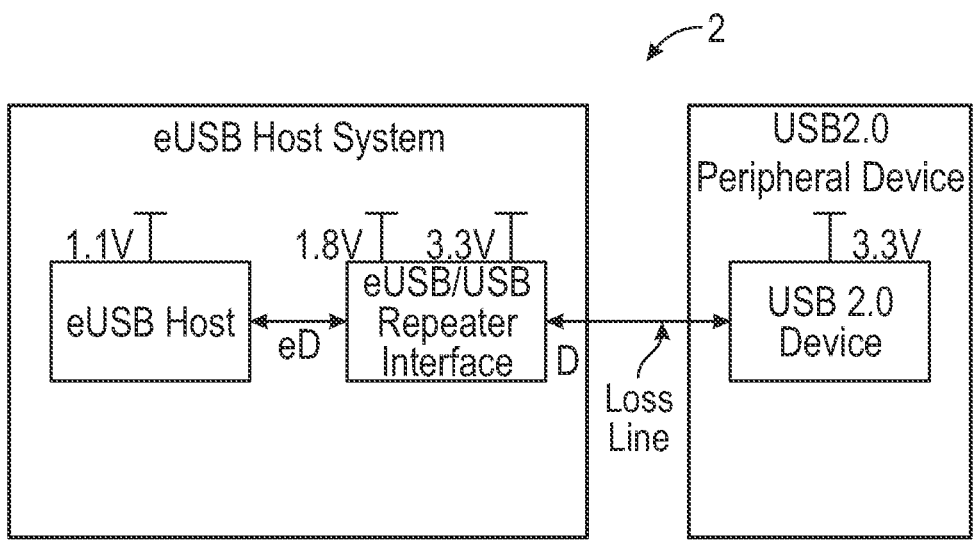
FIG. 1 is a block diagram of an implementation of an embedded universal serial bus system coupled with a legacy universal serial bus 2.0 device.

FIG. 1 illustrates a block diagram of an embedded USB system 2 coupled with a legacy USB 2.0 system. As indicated, the eUSB hosted system operates at 1.0-1.2 V and uses an embedded communication line (eD) to a eUSB/USB 2.0 repeater interface that operates on one side at 1.8 V and outputs at 3.3 V to a second communication line indicated as last line D connected to a USB 2.0 peripheral device operating at 3.3 V. FIG. 1 illustrates the environment which a host device utilizing the embedded universal serial bus protocol finds itself in when attempting to communicate with a legacy universal serial bus system of any kind (USB 1.0, 1.1, 2.0, etc.). During operation, the ability of the repeater interface to ensure accurate data transmission at a minimum power may be an operational and design goal. The repeater interface also has to deal with the ability to convert the data transfer rates between the eUSB host and the USB 2.0 device as well.

Figure 2:
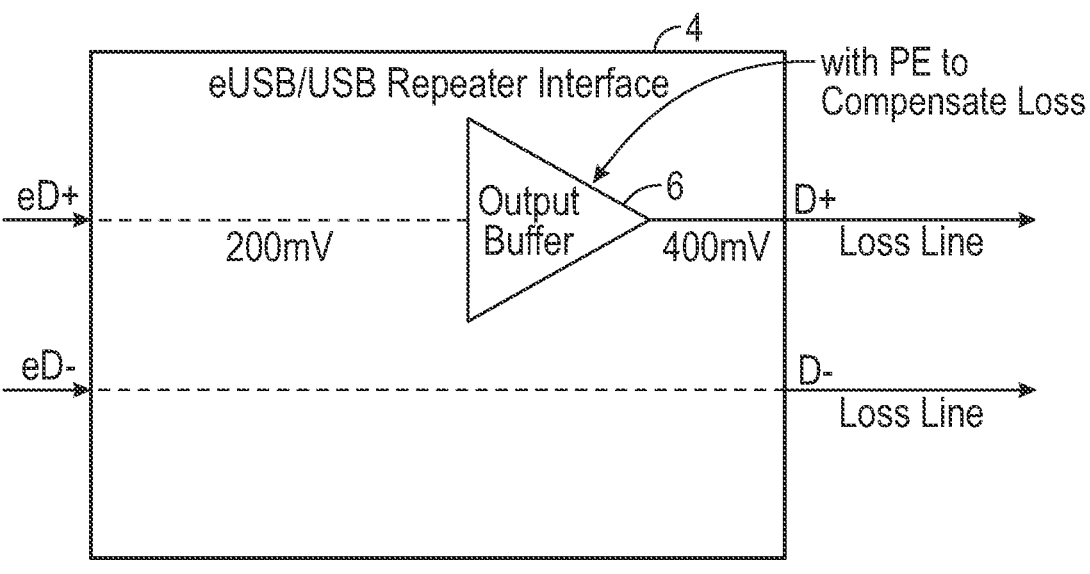
FIG. 2 is a diagram view of an embedded universal serial bus/universal serial bus repeater interface system.

FIG. 2 illustrates a block diagram view of the basic components of a eUSB/USB 2.0 repeater interface implementation. Here a positive (eD+) and negative (eD−) data line enter into one side of the interface 4 and then come out as a positive loss line (D+) and negative loss line (D−) at the USB. 2.0 voltage and data rate (480 Mb/sec in various implementations). The repeater interface that accomplishes this may, in various implementations, convert the output voltage from 200 mV to 400 mV and use an output buffer 6 to transmit high speed data (480 Mb/sec) for the USB 2.0 device. As indicated in FIG. 2, the use of pre-emphasis is also utilized by the repeater interface to prevent loss of information during transmission caused by the loss of higher frequency components of the data signal. Pre-emphasis involves increasing a voltage or decreasing a voltage at the beginning or ending of a voltage swing corresponding with a specific data signal. The pre-emphasis creates a temporarily varying initial higher voltage which decays down (or up to) a steady state voltage for each of the voltage signals associated with the transmission. The use of the pre-emphasis helps compensate for transmission losses in the higher order frequencies of the data signal. The various repeater interface is disclosed in this document include the ability to transmit using pre-emphasis.

Figure 3:
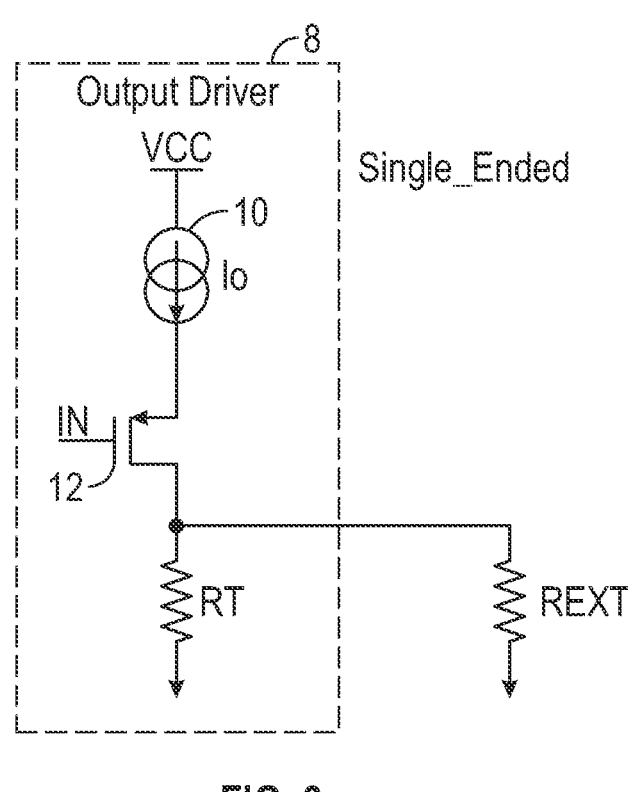
FIG. 3 is a schematic view of a current mode logic output driver implementation.
Figure 4:
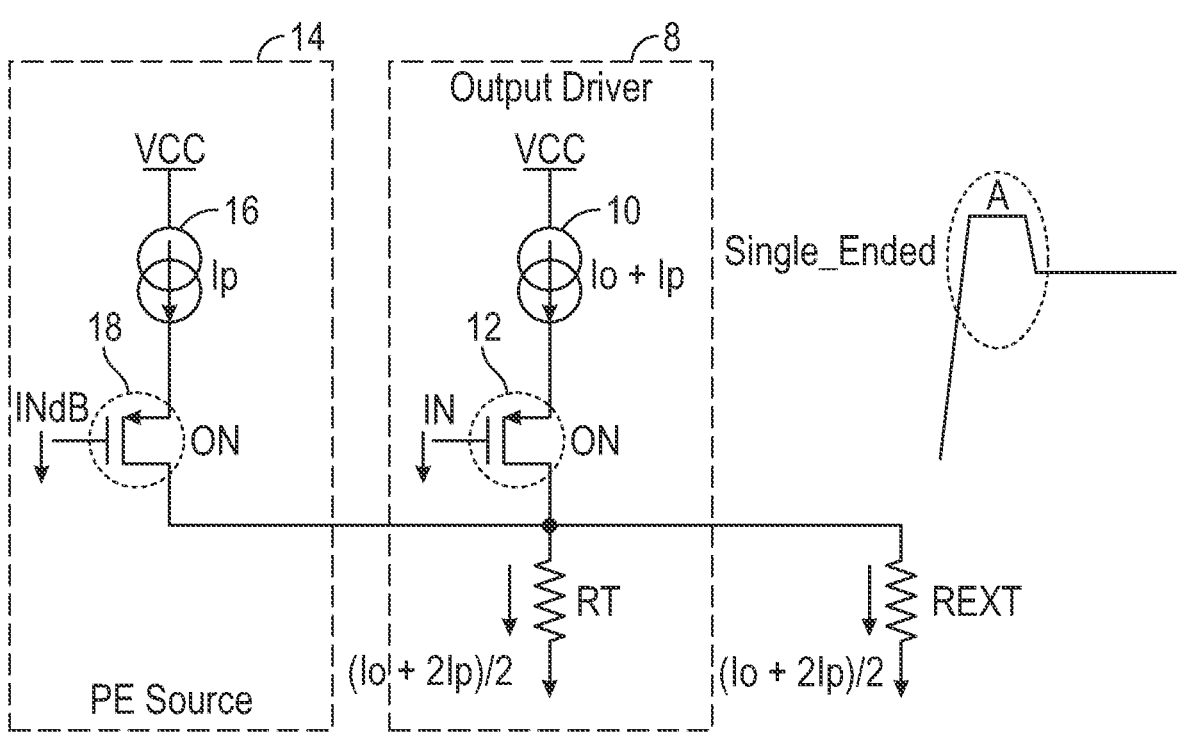
FIG. 4 is a schematic view of a current mode logic output driver implementation coupled with a pre-emphasis source and in final device represented by a resistor during a pre-emphasis period.
Figure 5:
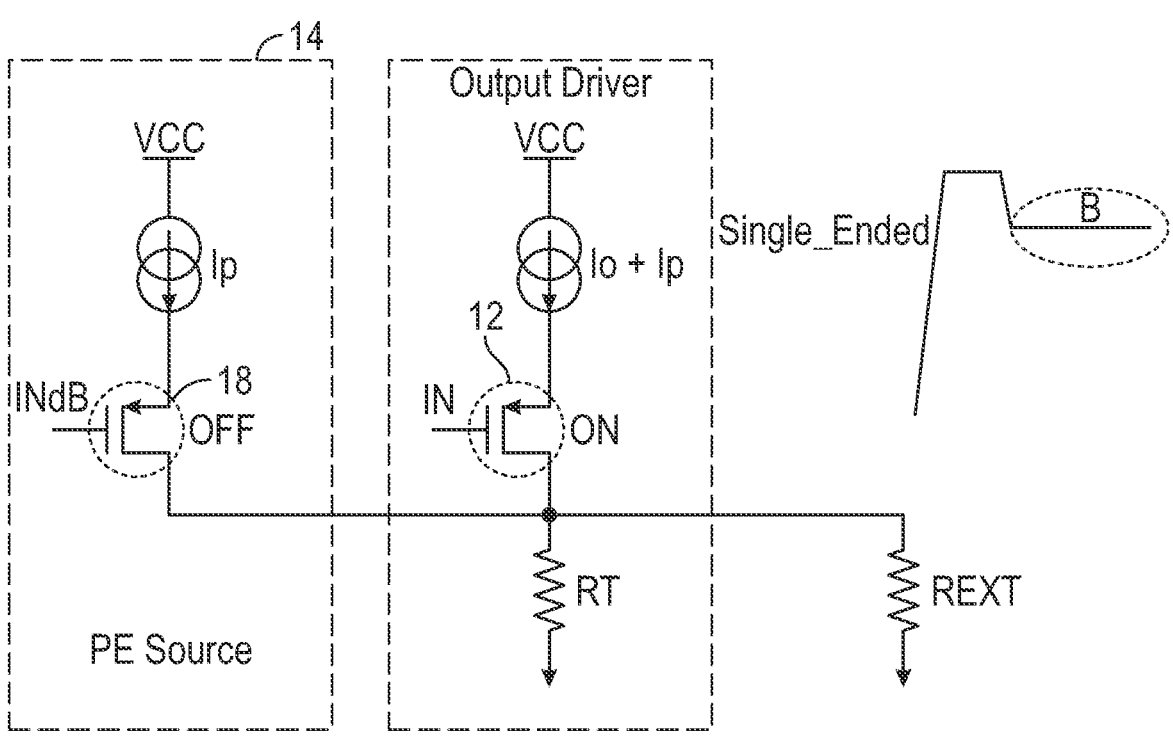
FIG. 5 is a schematic view of the implementation of FIG. 4 during a steady state period.

One technique used to create pre-emphasis is the use of current mode logic circuits like the output driver implementation 8 illustrated in FIG. 3. As illustrated the output driver includes a current source 10 coupled to VCC controlled by a transistor switch 12 coupled in parallel with resistor RT and with the external load REXT which represents the external device to which the driver is coupled. FIG. 4 illustrates the output driver 8 coupled with a pre-emphasis source 14 that includes another current source Ip 16 also coupled to VCC controlled by a delay transistor 18. FIG. 4 includes a waveform on the right that shows that during signal period A the pre-emphasis manifests itself as an increased voltage created by the increased voltage supplied by the pre-emphasis source 14 when the delay transistor 18 is switched on in conjunction with the transistor switch 12 in the output driver 8. The total amount of pre-emphasis voltage created is a function of the currents from the current sources 10, 16 as indicated by the equation (Io+2Ip)/2. FIG. 5 illustrates the operation of the repeater system during a steady state period indicated by B in the waveform on the left. Steady state is achieved when the pre-emphasis source 14 is deactivated by turning the delay transistor 18 off while the transistor switch 12 remains switched on.

One of the challenges of using a repeater interface that employs current mode logic like that illustrated in FIGS. 3-5 is that the system consumes a considerable amount of power. For a given swing of 400 mV and for a given termination impedance of 45 Ohms, the implementation illustrated in FIGS. 3-5 the repeater implementation consumes 17.77 mA ((400 mV/45 Ohms)*2). In various voltage mode architectures disclosed herein for the repeater interfaces Vreg is selected to be twice of the targeted swing and pre-emphasis voltages.

Figure 6:
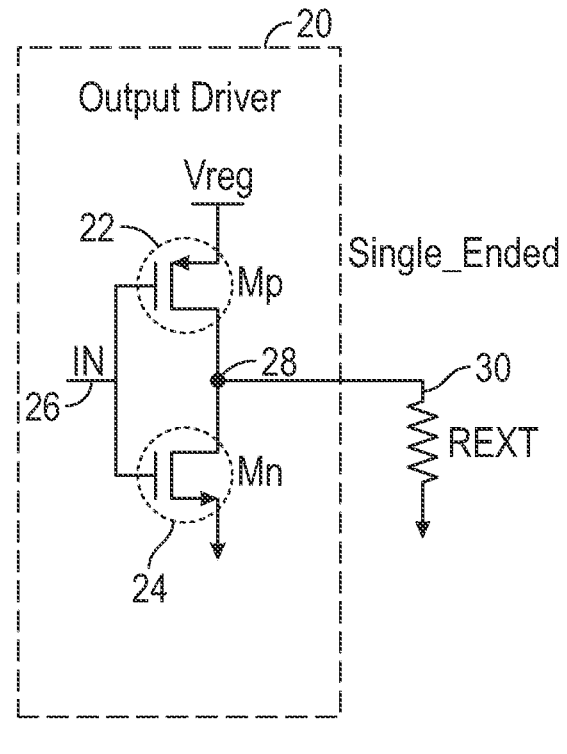
FIG. 6 is a schematic view of an implementation of an output driver.
Figure 7:
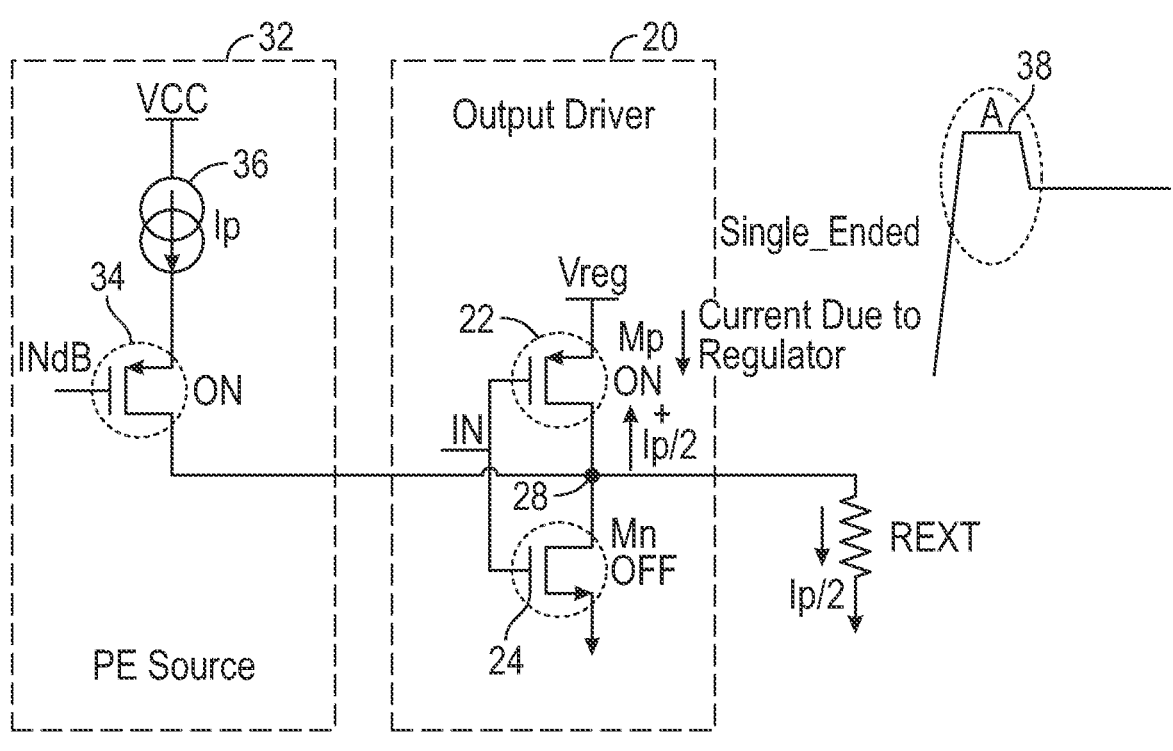
FIG. 7 is a schematic view of an implementation of an output driver coupled with a pre-emphasis source and with an external device represented by a resistor during a pre-emphasis period.

Referring to FIG. 6, another implementation of an output driver 20 is illustrated that includes a pre-emphasis transistor 22 (Mp) coupled in parallel with a steady state transistor 24 (Mn) and an input 26. The pre-emphasis transistor 22 and the steady state transistor 24 are both coupled in parallel with an output 28 of the output driver 20 which is coupled to a USB device represented as external resistance 30 (REXT). FIG. 7 illustrates the output driver 20 coupled with a pre-emphasis source 32 which operate similarly to the one illustrated in FIGS. 4 and 5. As illustrated in FIG. 7, when the delay transistor 34 activates voltage from the pre-emphasis current source 36 joins the voltage Vreg applied at output 28 of the output driver, thus creating a pre-emphasis voltage spike 38 (A) as illustrated in the waveform illustrated to the left of FIG. 7. As can be seen by inspection, the pre-emphasis voltage profile is determined by a mix of the voltage Vreg and the current of the pre-emphasis current source Ip 36. What is omitted in FIG. 7 is the presence of two additional resistors between the pre-emphasis transistor 22 and the steady state transistor 24 which are not shown for the purposes of illustration but which can be seen in the implementation illustrated in FIG. 9.

Figure 8:
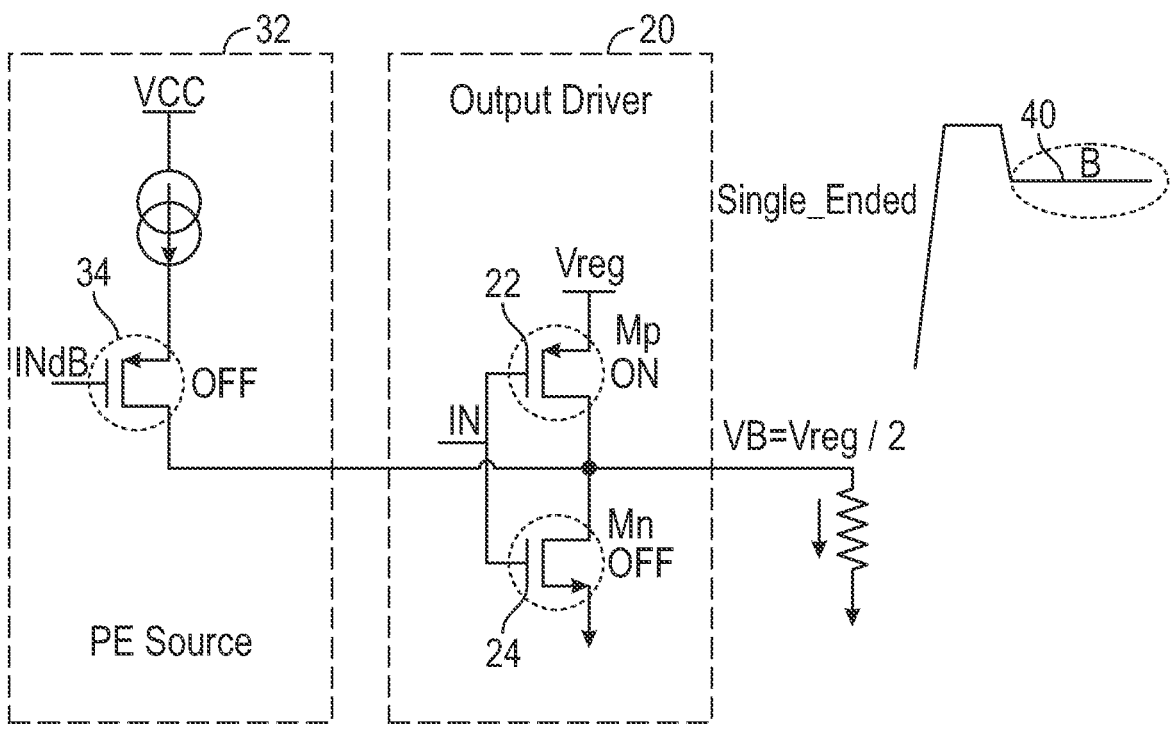
FIG. 8 is a schematic view of the implementation of FIG. 7 during a steady state period.

FIG. 8 illustrates the operation of the repeater interface during a steady state period 40 (B) of the waveform illustrated on the left of FIG. 8. As illustrated during this stage of operation, the delay transistor 34 of the pre-emphasis source 32 is turned off while the pre-emphasis transistor 22 remains on and a steady state transistor 24 remains off. The voltage of the system then decays to half of the regulation voltage (Vreg) which is maintained during the steady state operation. While the waveforms illustrated in FIG. 7 and FIG. 8 both illustrate pre-emphasis on the rising side of the signal, the similar principles are applied when the pre-emphasis is applied to the falling side of the signal which will be discussed hereafter.

Implementations of repeater interfaces like those illustrated in FIGS. 6-8 consume less power during operation than those that employ a current mode logic approach. For example, where the swing is 400 mV and the termination impedance is 45 Ohms, the system consumes only 8.88 mA (800 mV/*(45 Ohms+45 Ohms)) where the regulated voltage level is 800 mV. This difference in amperage results in a significant power savings.

Figure 9:
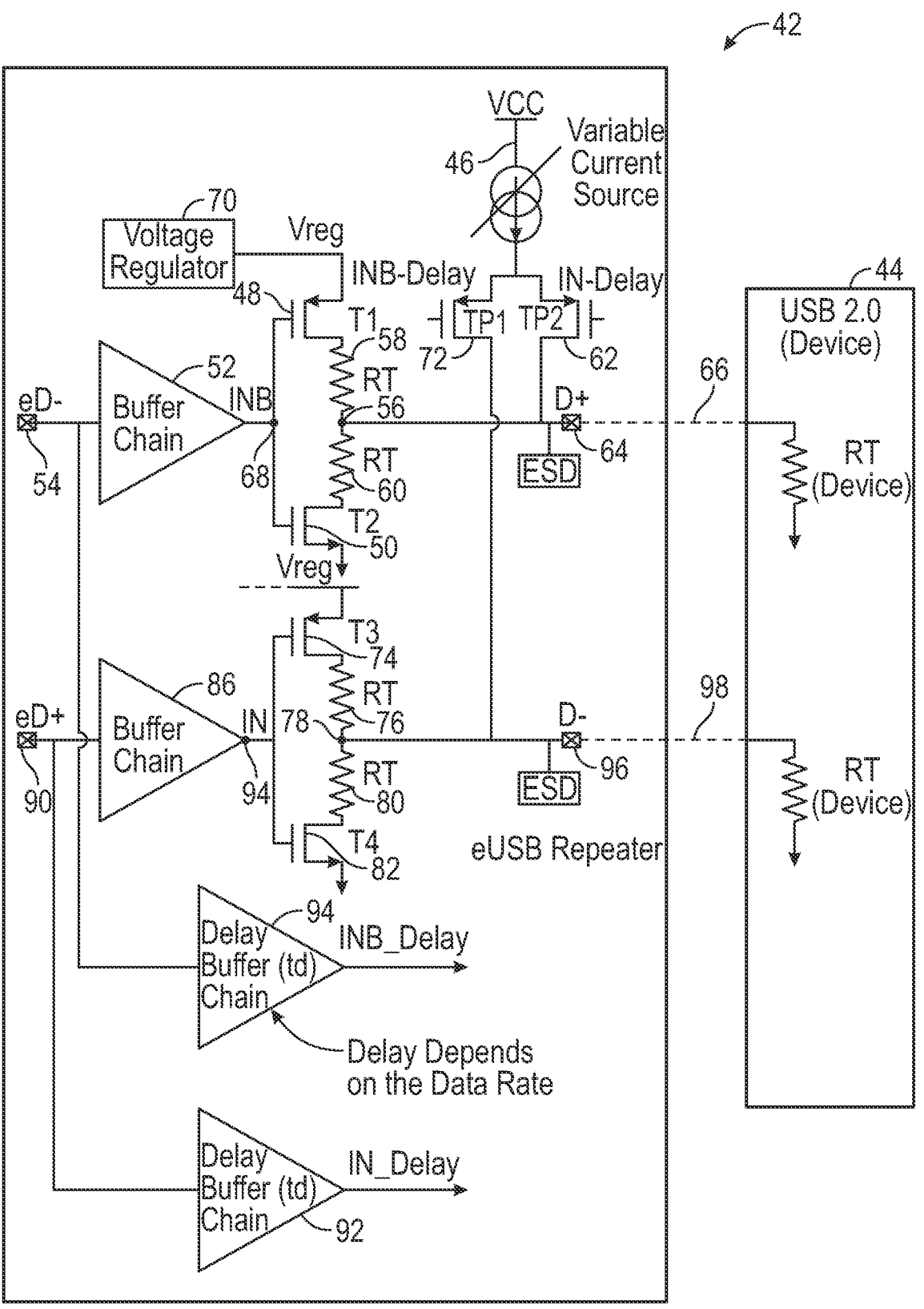
FIG. 9 is a schematic of an implementation of a repeater interface containing various buffers coupled with a universal serial bus 2.0 device.

Referring to FIG. 9, an implementation of a repeater interface 42 is illustrated coupled with a USB 2.0 device 44. This device implementation includes an output driver and a pre-emphasis source like that illustrated in FIGS. 6-7 arranged slightly differently. In this implementation a common variable current source/pre-emphasis current source 46 is employed to aid in applying pre-emphasis to both the rising side and the falling side of the signal. Here a pre-emphasis transistor 48 (T1) is coupled in parallel with steady state transistor 50 (T2) and with input from buffer chain 52 which is coupled to the negative input 54 (eD−) of an embedded universal serial bus device. A first resistor 58 (RT) is coupled between the pre-emphasis transistor 48 and output 56 of the output driver and a second resistor 60 (RT) is coupled between the output 56 and the steady state transistor 50. The resistances of the first resistor 58 and the second resistor 60 are set to the same value. A first delay transistor 62 is coupled between the variable current source 46 and the output of the interface 64 (D+) to which the positive loss line 66 of the USB 2.0 device 44 is coupled. As illustrated, the gates of the pre-emphasis transistor 48 and the steady state transistor are coupled together and to the buffer chain output 68. As illustrated, a voltage regulator 70 is used to create the voltage Vreg which is applied to the source of the pre-emphasis transistor 48.

Second delay transistor 72 is coupled with the output of a second output driver that includes Vreg coupled to the source of second pre-emphasis transistor 74 (T3) which is connected through third resistor 76 (RT) to output 78. Fourth resistor 80 (RT) is coupled to a second steady state transistor 82 (T4). The gates of the second pre-emphasis transistor 74 and the steady state transistor 82 are coupled together and to output 84 of second buffer chain 86 which is coupled to the positive output 90 of an embedded universal serial bus device. The gates of the first delay transistor 62 and the second layer transistor 72 are coupled to first delay buffer chain 92 and second delay buffer chain 94, respectively. In various implementations, the first delay transistor may be referred to as a first delay buffer chain delay transistor. During operation of the system the delay buffer chains ensure the proper timing of the application of the pre-emphasis. In other words the timing of the delay depends on the data rate. Output 78 of the second output driver is coupled to the negative output 96 of the repeater interface 42 which is coupled to negative loss line 98 and coupled to negative signal input of USB 2.0 device 44. In various implementations, the first pre-emphasis transistor T1 and the second pre-emphasis transistor T3 may be PMOS transistors and the first steady state transistor T2 and the second steady state transistor T4 are both NMOS transistors. In various implementations the buffers may be buffer chains.

Figure 10:
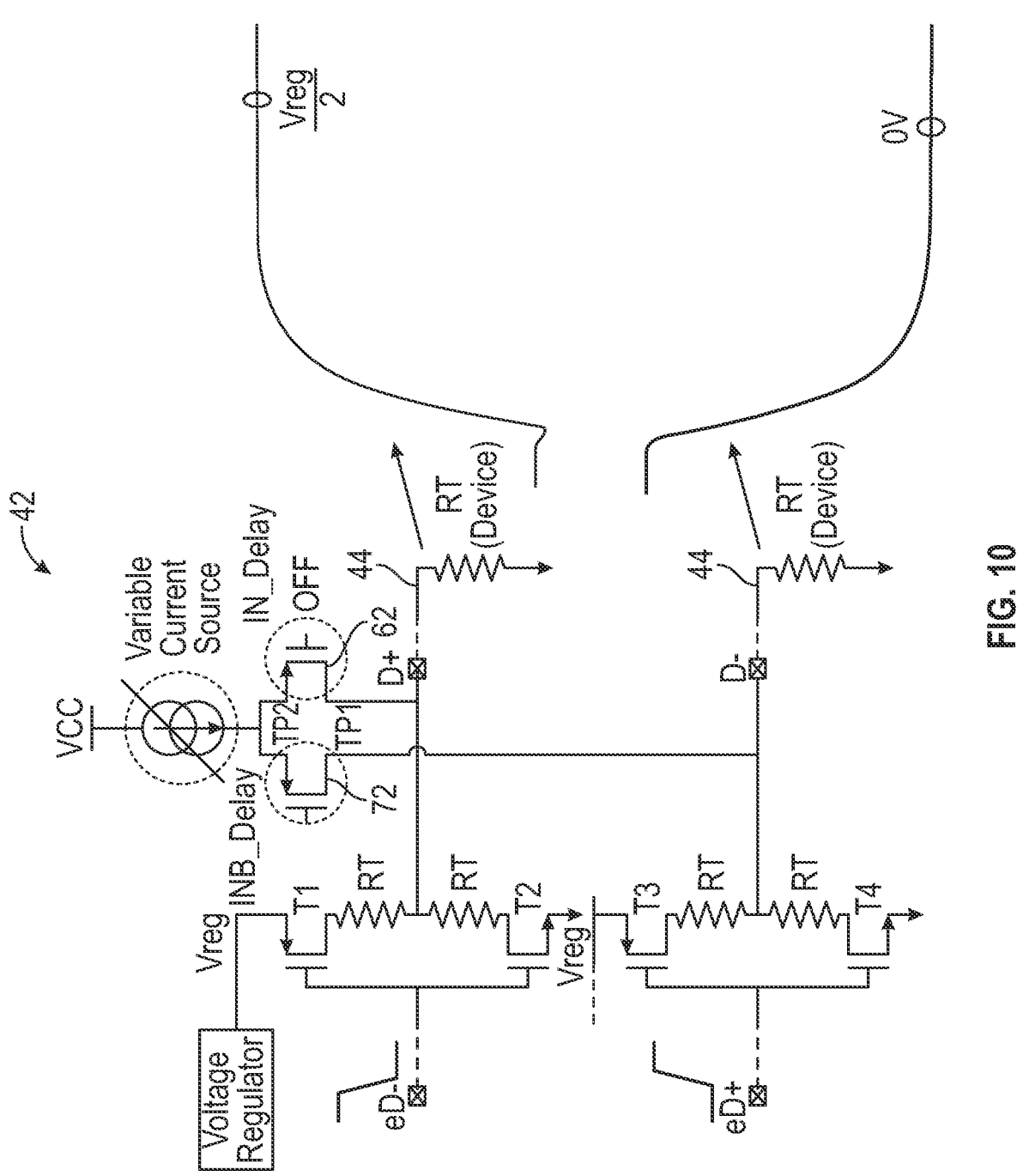
FIG. 10 is a schematic of the output driver and pre-emphasis portions of the implementation of FIG. 9 with no pre-emphasis.
Figure 11:
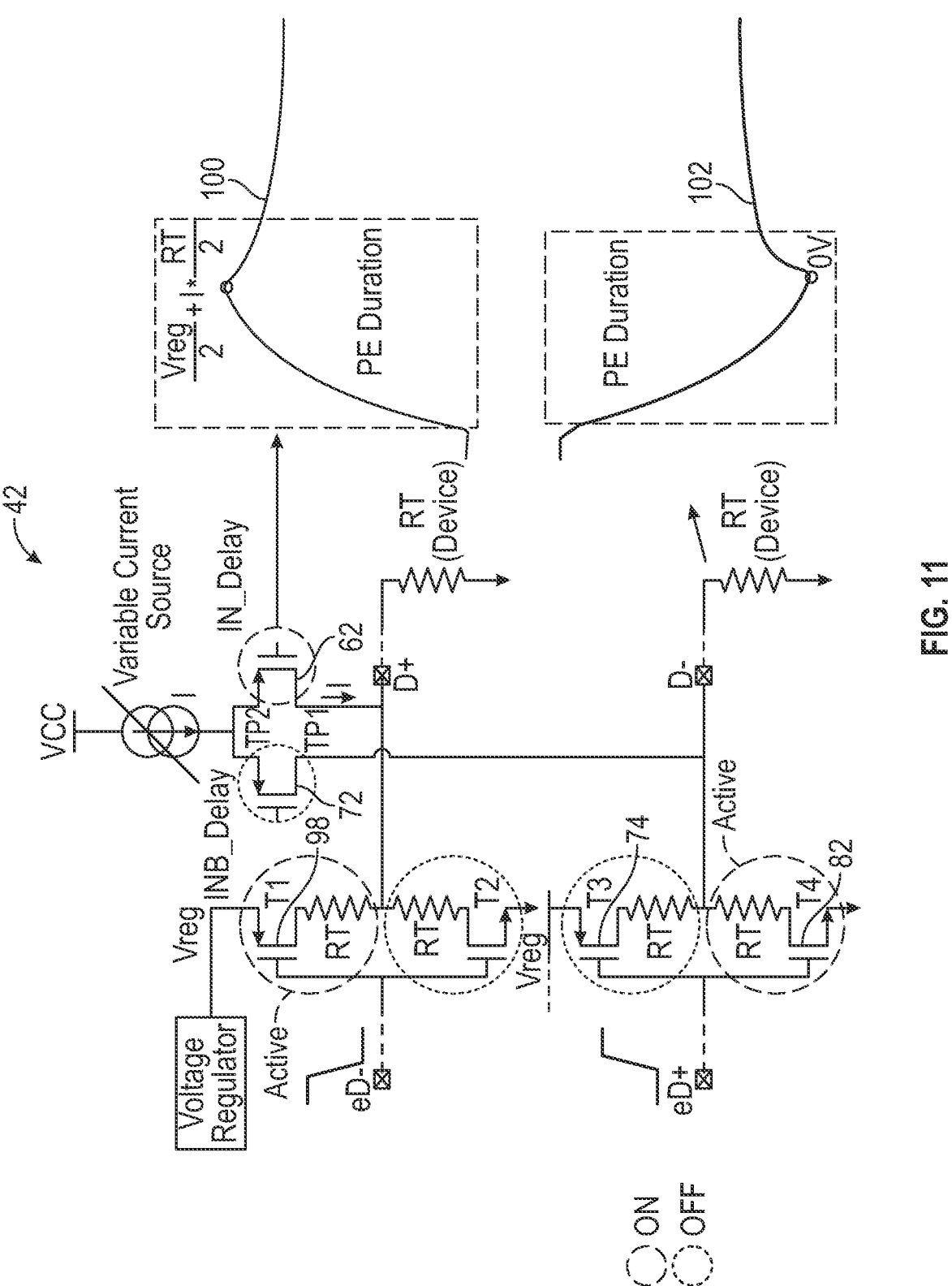
FIG. 11 is a schematic of the output driver and pre-emphasis portions of the implementation of FIG. 9 with pre-emphasis.

FIG. 10 illustrates operation of the repeater interface 42 with no pre-emphasis added. In this illustration various components of the repeater interface 42 are omitted for clarity such as the buffer chains. In this implementation both the first delay transistor 62 and the second delay transistor 72 are both off. The resulting waveform on the positive and negative side of the USB 2.0 device 44 both show a rising voltage to Vreg/2 or a falling voltage to 0 V with no pre-emphasis. Note that Vreg is set as twice the voltage used by the USB protocol used by the device 44. In this case, the voltage of the device 44 is twice as large as that used by the eUSB device (400 mV versus 200 mV). FIG. 11 illustrates the repeater interface 42 during addition of pre-emphasis on the leading edge and falling edge of a data signal. To generate the pre-emphasis on the leading edge, with the first output driver, the first pre-emphasis transistor 48 is turned on while the same time first delay transistor 62 is also turned on creating a rising pre-emphasis voltage and the signal as seen in waveform 102 on the right. To generate pre-emphasis on the falling edge the second steady state transistor 82 is turned on while the second delay transistor 72 is turned off thus causing the voltage to drop substantially to zero at the end of the falling image of the signal 102 as illustrated in FIG. 11.

Figure 12:
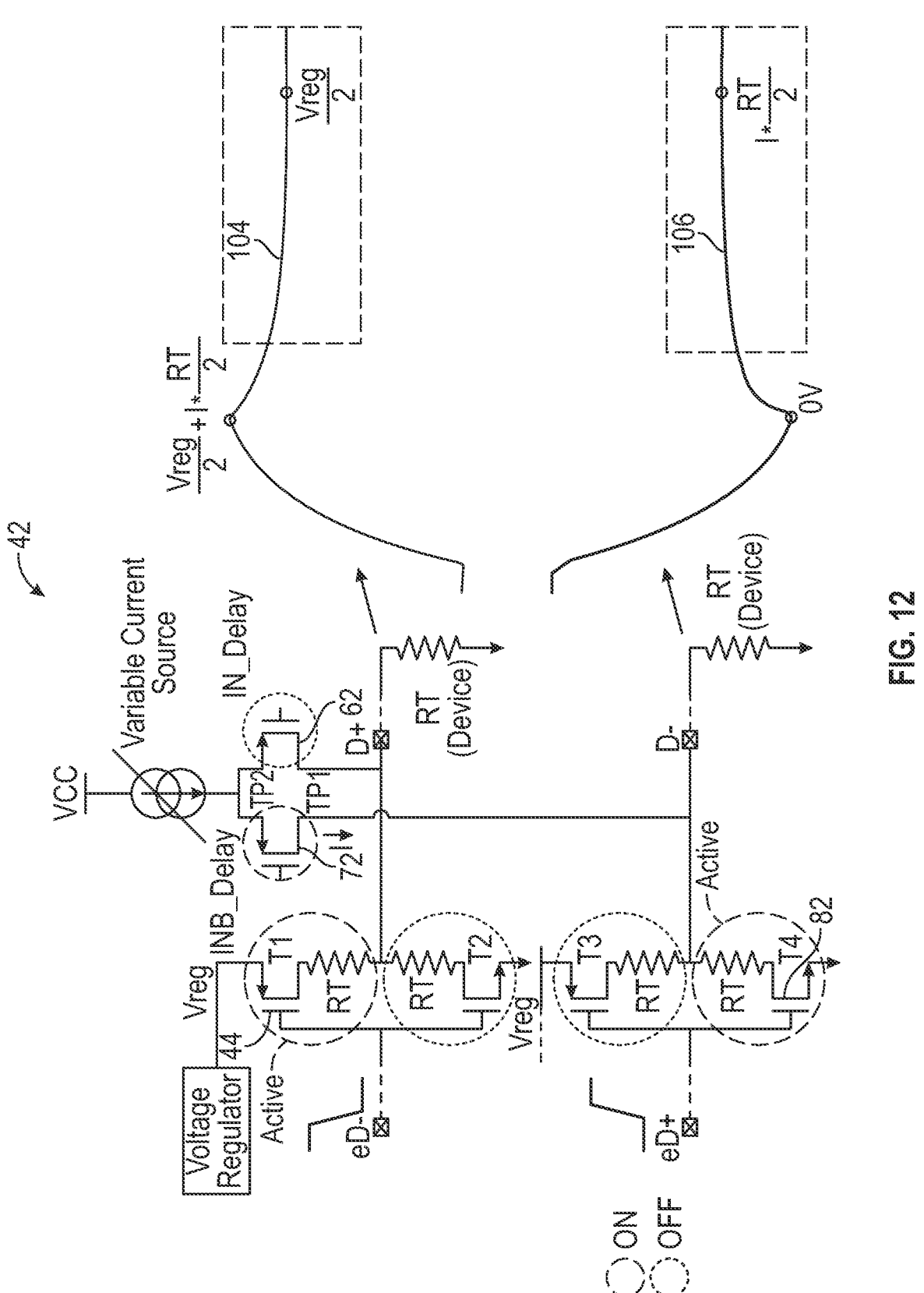
FIG. 12 is a schematic of the output driver and pre-emphasis portions of the implementation of FIG. 9 during pre-emphasis.
Figure 13:
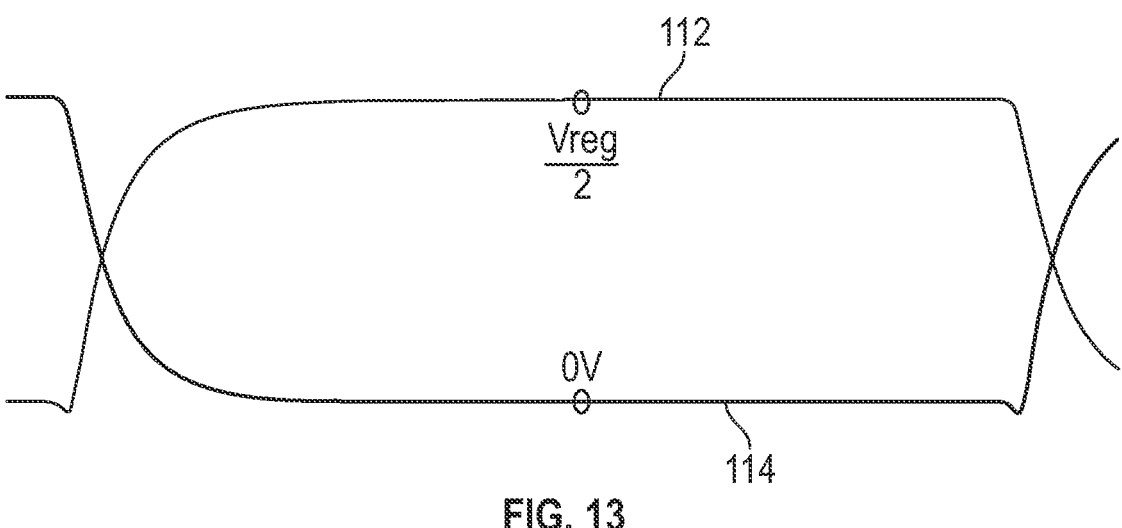
FIG. 13 is an output waveform with pre-emphasis disabled.
Figure 14:
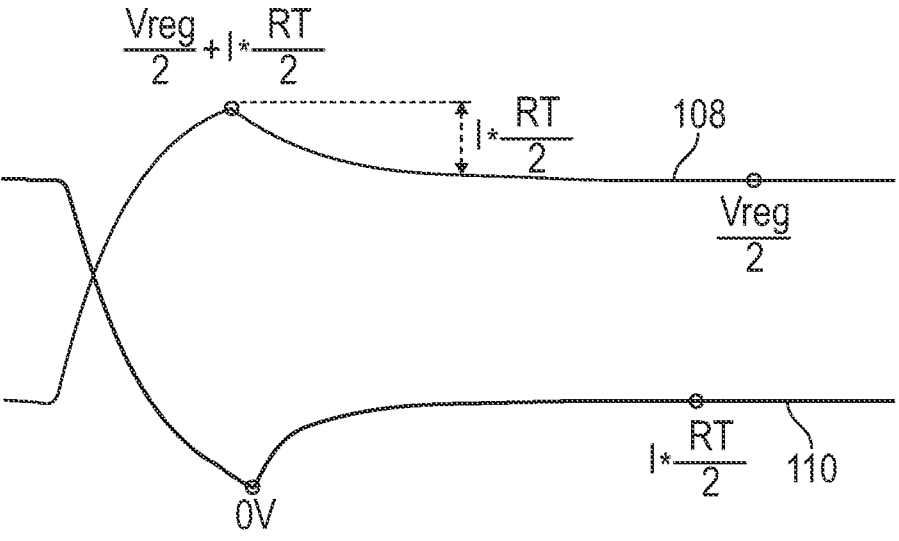
FIG. 14 is an output waveform with pre-emphasis enabled.

FIG. 12 illustrates operation of the repeater interface 42 during a steady state period illustrating how, following the pre-emphasis on the rising edge, the first delay transistor 62 turned off while the first pre-emphasis transistor 48 remains on and the voltage waveform decays to Vreg/2 as illustrated in waveform 104. On the falling edge side, the voltage rises to a steady state value through switching on second delay transistor 72 and keeping second steady state transistor 82 on as well which causes the voltage to rise from substantially 0 V to a steady state value as observed in waveform 106. The complete cycle for the rising and falling portions of the signal can be observed in the superimposed rising waveform 108 and falling waveform 110 illustrated in FIG. 14. FIG. 13 illustrates the waveform shape with no pre-emphasis on the rising side with waveform 112 and on the falling side with waveform 114.

Figure 15:
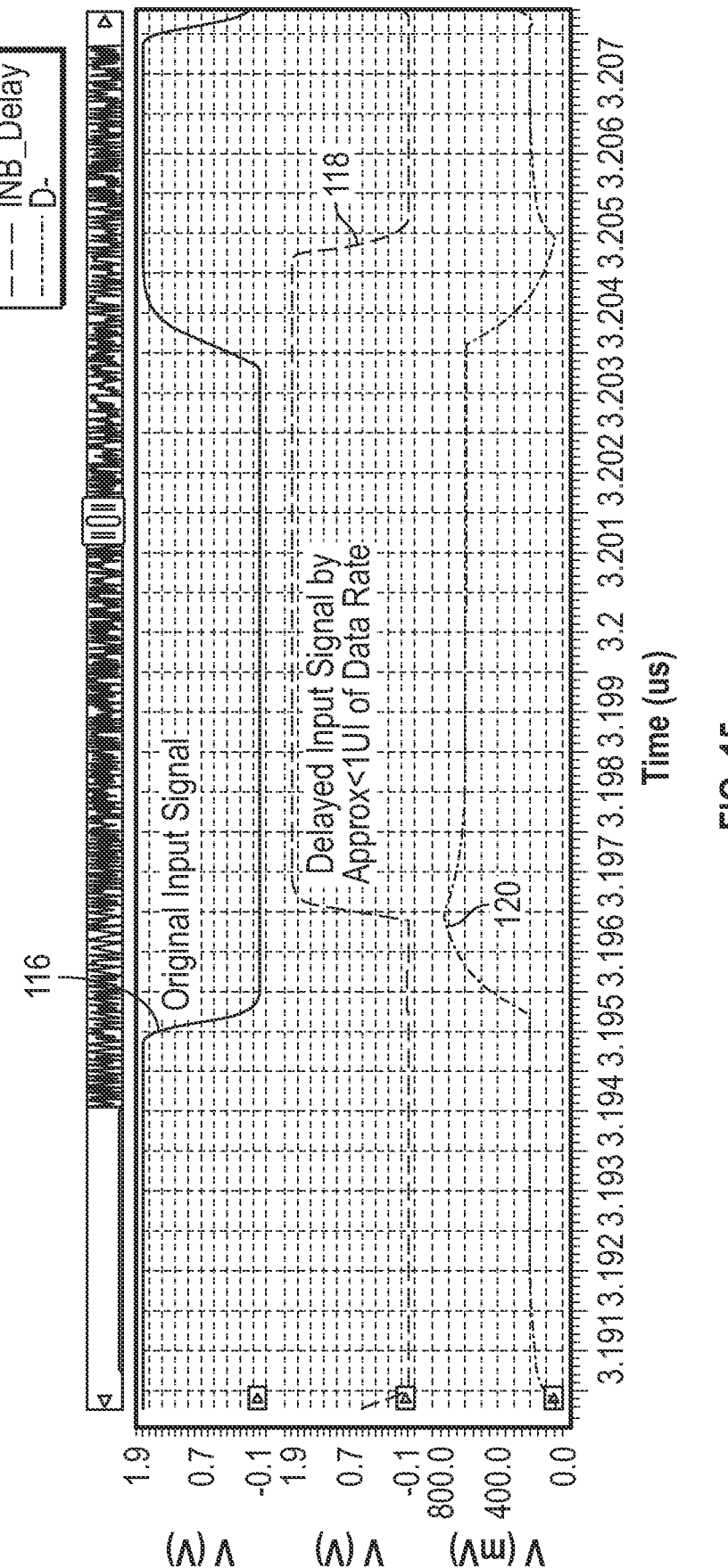
FIG. 15 demonstrates various wave-forms during a simulation of an implementation of a repeater interface disclosed herein.
Figure 16:
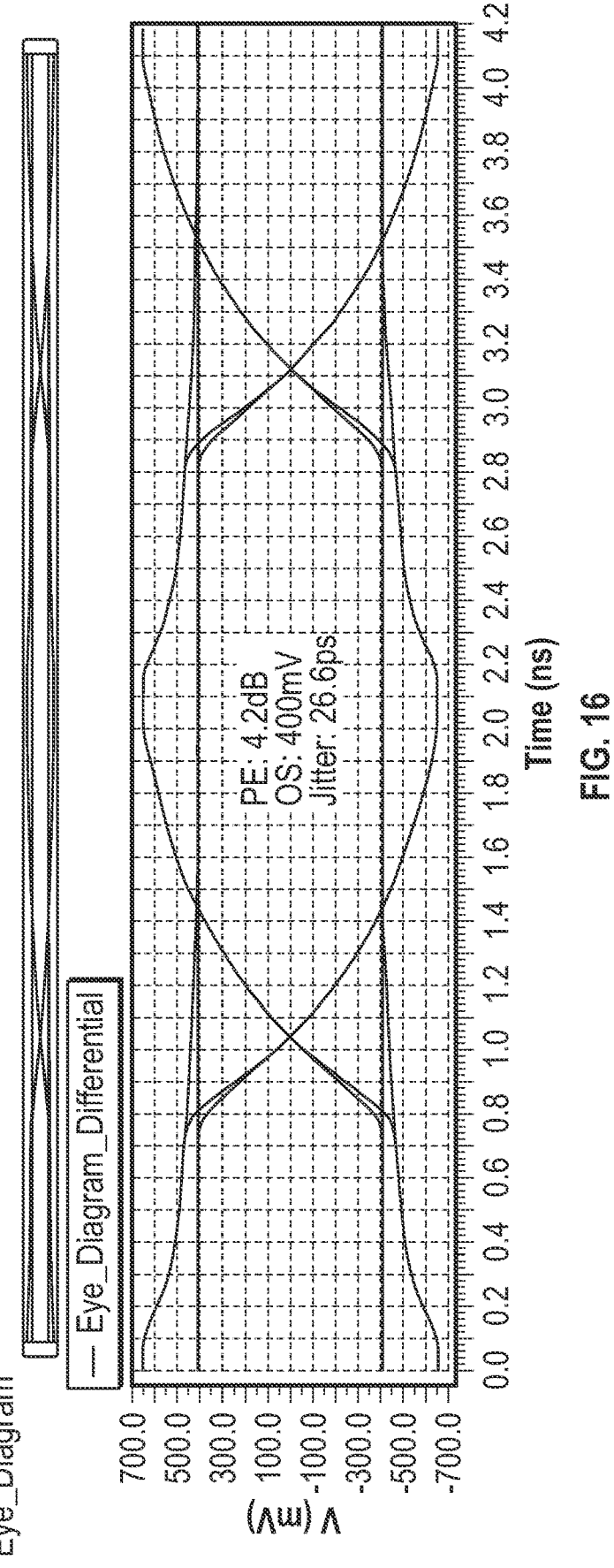
FIG. 16 is an eye diagram of a simulation of an implementation of a repeater interface like those disclosed herein.

The timing used to determine the delay may be based on the unit interval of the data rate used by the receiving universal serial bus device. The delay buffer chains may be used to help insure that the delay occurs time period equal to the unit interval of the data rate. Referring to FIG. 15 a simulation of a repeater interface implementation is illustrated showing the original signal 16 at the top and delayed signal 118 which has been delayed by approximately one unit interval along with the pre-emphasized signal 120 below showing the pre-emphasis on the rising and falling edges of the signal. FIG. 16 illustrates and eye diagram of an implementation of a pre-emphasized signal during a simulation.

While particular implementations of repeater interfaces have been disclosed in this document applied to universal serial bus systems, the principles disclosed herein may be applied to a wide variety of other interface designs including, by non-limiting example, peripheral component interconnect express (PCIe) systems, serial communication systems, serial AT attachment systems, and any other data communication system where changes in signal voltage and/or data rate may be needed. Also, the amount of pre-emphasis applied may be determined by the higher order frequencies and voltage levels of the particular signals involved.

In places where the description above refers to particular implementations of pre-emphasis buffer system and implementing components, sub-components, methods and sub-methods, it should be readily apparent that a number of modifications may be made without departing from the spirit thereof and that these implementations, implementing components, sub-components, methods and sub-methods may be applied to other pre-emphasis buffer systems.

What is claimed is:

1. A pre-emphasis signal processing system comprising:
an output driver comprising:
a pre-emphasis transistor coupled with a steady state transistor, where gates of the pre-emphasis transistor and steady state transistor are coupled together;
a regulator voltage input coupled to a source of the pre-emphasis transistor;
a first resistor coupled between a drain of the pre-emphasis transistor and an output of the output driver; and
a second resistor coupled between a drain of the steady state transistor and the output of the output driver; and
a pre-emphasis source comprising a current source coupled to a delay transistor, the delay transistor coupled with the output of the output driver.

2. The system of claim 1, wherein the delay transistor is a first delay buffer chain delay transistor.

3. The system of claim 2, further comprising a second delay buffer chain delay transistor.

4. The system of claim 1 wherein the output of the output driver is configured to be coupled to a signal input of a universal serial bus 2.0 device.

5. The system of claim 1, wherein the pre-emphasis transistor and the steady state transistor are coupled in parallel with the output of the output driver.

6. The system of claim 1, further comprising an output of a buffer chain coupled to a signal input of the output driver.

7. The system of claim 6, wherein a signal input of the buffer chain is configured to couple with an embedded universal serial bus device.

8. A pre-emphasis signal processing system comprising:
a first output driver comprising:
a first pre-emphasis transistor coupled with a first steady state transistor, where gates of the first pre-emphasis transistor and the first steady state transistor are coupled together;
a regulator voltage input coupled to a source of the first pre-emphasis transistor; and
a first signal input coupled with a first buffer chain configured to be coupled to a negative terminal of an input device; and
a first pre-emphasis source comprising a pre-emphasis current source coupled to a first delay transistor, the first delay transistor coupled with an output of the first output driver;
a second output driver comprising:
a second pre-emphasis transistor coupled with a second steady state transistor, where gates of the second pre-emphasis transistor and the second steady state transistor are coupled together;
the regulator voltage input coupled to a source of the second pre-emphasis transistor; and
a second signal input coupled with a second buffer chain configured to be coupled to a positive terminal of the input device; and a second pre-emphasis source comprising the pre-emphasis current source coupled to a second delay transistor, the second delay transistor coupled with an output of the second output driver.

9. The system of claim 8, further comprising:

a first resistor coupled between a drain of the first pre-emphasis transistor and the output of the first output driver;

a second resistor coupled between a drain of the first steady state transistor and the output of the first output driver;

a third resistor coupled between the drain of the second pre-emphasis transistor and the output of the second output driver; and a fourth resistor coupled between the drain of the second steady state transistor and the output of the second output driver.

10. The system of claim 8, wherein the first delay transistor and the second delay transistor are first delay buffer chain delay transistors.

11. The system of claim 10, further comprising a third delay buffer chain delay transistor and a fourth delay buffer chain delay transistor.

12. The system of claim 8, wherein the output of the first output driver and the output of the second output driver are configured to be coupled to a positive signal input and to a negative signal input, respectively, of a universal serial bus 2.0 device.

13. The system of claim 8, wherein the first pre-emphasis transistor and the second pre-emphasis transistor are both PMOS transistors and the first steady state transistor and the second steady state transistor are both NMOS transistors.

14. The system of claim 8, further comprising an output of a first buffer chain coupled to a signal input of the first output driver and an output of a second buffer chain coupled to a signal input of the second output driver.

15. The system of claim 14, wherein a signal input of the first buffer chain is configured to couple with a negative terminal of an embedded universal serial bus device and a signal input of the second buffer chain is configured to couple with a positive terminal of the embedded universal serial bus device.

16. A method of pre-emphasis signal processing, the method comprising:

generating rising pre-emphasis in a voltage signal by:

using a first output driver, turning on a first pre-emphasis transistor, a regulator voltage input coupled with a source of the first pre-emphasis transistor; and using a first pre-emphasis source, turning on a first delay transistor coupled to a first pre-emphasis current source and to an output of the first output driver;

increasing an initial voltage of an input signal received by the first output driver using the first pre-emphasis current source and a resistor coupled between a drain of the first pre-emphasis transistor and an output of the first output driver; and generating falling pre-emphasis in the voltage signal by:

using a second output driver, turning on a steady state transistor; and using a second pre-emphasis source, turning off a second delay transistor coupled to the first pre-emphasis current source and with an output of the second output driver; and decreasing an initial voltage of the input signal received by the second output driver using the first pre-emphasis current source and a resistor coupled between a drain of a second pre-emphasis transistor and an output of the second output driver.

17. The method of claim 16, wherein the output of the first output driver and the output of the second output driver are configured to be coupled to a positive signal input and to a negative signal input, respectively, of a universal serial bus 2.0 device.

18. The method of claim 16, further comprising:

buffering data using a first buffer chain coupled to a signal input of the first output driver; and buffering data using a second buffer chain coupled to a signal input of the second output driver.

19. The method of claim 18, further comprising:

delaying data for a period of a unit interval of a data rate using a first delay buffer chain coupled to a signal input of the first output driver;

delaying data for the period of the unit interval of the data rate using a second delay buffer chain coupled to a signal input of the second output driver; and using the first delay buffer chain and the second delay buffer chain, timing the rising pre-emphasis and the falling pre-emphasis in the voltage signal.

20. The method of claim 18, wherein a signal input of the first buffer chain is configured to couple with a negative terminal of an embedded universal serial bus device and a signal input of the second buffer chain is configured to couple with a positive terminal of the embedded universal serial bus device.

* * * * *